(12) United States Patent
Entringer et al.

(10) Patent No.: US 9,075,094 B2
(45) Date of Patent: Jul. 7, 2015

(54) METHOD OF MEASURING A PHYSICAL PARAMETER AND ELECTRONIC INTERFACE CIRCUIT FOR A CAPACITIVE SENSOR FOR IMPLEMENTING THE SAME

(71) Applicant: EM MICROELECTRONIC-MARIN SA, Marin (CH)

(72) Inventors: Christophe Entringer, Corcelles-pres-Concise (CH); Sylvain Grosjean, Les Fins (FR)

(73) Assignee: EM MICROELECTRONIC-MARIN SA, Marin (JP)

( * ) Notice: Subject to any disclaimer, the term of this patent is extended or adjusted under 35 U.S.C. 154(b) by 331 days.

(21) Appl. No.: 13/733,374

(22) Filed: Jan. 3, 2013

(65) Prior Publication Data

US 2013/0187668 A1 Jul. 25, 2013

(30) Foreign Application Priority Data

Jan. 20, 2012 (EP) ..................................... 12151951

(51) Int. Cl.
| | |
|---|---|
| G01R 27/26 | (2006.01) |
| G01P 15/125 | (2006.01) |
| G01L 5/16 | (2006.01) |
| G01D 5/24 | (2006.01) |

(52) U.S. Cl.
CPC .......... *G01R 27/2605* (2013.01); *G01P 15/125* (2013.01); *G01L 5/165* (2013.01); *G01D 5/24* (2013.01)

(58) Field of Classification Search
CPC ............................ G01D 5/241; G01R 27/2605
USPC ............................ 324/658–690; 345/173–178
See application file for complete search history.

(56) References Cited

U.S. PATENT DOCUMENTS

| | | | |
|---|---|---|---|
| 2008/0197861 | A1* | 8/2008 | Grosjean et al. .............. 324/661 |
| 2009/0241666 | A1 | 10/2009 | Gerfers et al. |
| 2010/0231237 | A1* | 9/2010 | Deschildre et al. ........... 324/661 |

FOREIGN PATENT DOCUMENTS

| | | |
|---|---|---|
| EP | 1 835 263 A1 | 9/2003 |
| EP | 2 343 507 A1 | 7/2011 |

(Continued)

OTHER PUBLICATIONS

H. Leuthold, et al., "An ASIC for High-resolution Capacitive Microaccelerometers", Sensors and Actuators A21-A23, 1990, pp. 278-281.

(Continued)

*Primary Examiner* — Arleen M Vazquez
*Assistant Examiner* — Robert P Alejnikov, Jr.
(74) *Attorney, Agent, or Firm* — Sughrue Mion, PLLC

(57) ABSTRACT

The method is for measuring a physical parameter by an electronic circuit connected to a two differential capacitor sensor having two fixed electrodes and a common moving electrode. The electronic circuit supplies first and second digital measuring signals. Each measuring cycle consists on biasing the electrodes by the measuring voltage based on the first digital signal, connecting the fixed electrodes to a supply voltage source for a first biasing, biasing the electrodes by the measuring voltage based on the second digital measuring signal, and inversely connecting the fixed electrodes to a supply voltage source for a second biasing. In first successive measuring cycles, the first and second digital signals are adapted to each cycle by a large step value. In second successive measuring cycles, the first and second digital signals are adapted to each cycle by a small step value until the end of the conversion.

11 Claims, 6 Drawing Sheets

(56) References Cited

FOREIGN PATENT DOCUMENTS

| WO | 2006/070272 A2 | 7/2006 |
| WO | 2008/107737 A1 | 9/2008 |

OTHER PUBLICATIONS

Yen S. Yee, et al., "A 1 mV MOS Comparator", IEEE Journal of Solid-State Circuits, Jun. 1978, pp. 294-298, vol. SC-13, No. 3.

* cited by examiner

METHOD OF MEASURING A PHYSICAL PARAMETER AND ELECTRONIC INTERFACE CIRCUIT FOR A CAPACITIVE SENSOR FOR IMPLEMENTING THE SAME

This application claims priority from European Patent Application No. 12151951.6 filed Jan. 20, 2012, the entire disclosure of which is incorporated herein by reference.

FIELD OF THE INVENTION

The invention concerns a method of measuring a physical parameter, such as an acceleration, angular speed, force or pressure, by means of an electronic interface circuit connected to a capacitive sensor.

The invention also concerns an electronic interface circuit for a capacitive sensor for implementing the measuring method. The capacitive sensor is formed of at least two differential connected capacitors. A common electrode of the capacitors is capable of moving between two fixed electrodes under the action, for example, of a force in order to alter the capacitive value of each capacitor.

BACKGROUND OF THE INVENTION

In a simple conventional capacitive sensor design, the common electrode, which is mobile, forms part of an armature resiliently held between the two fixed electrodes. In this case, the capacitive sensor may be capable of performing a measurement along one direction of movement of the moving electrode. At rest, this common moving electrode is normally equidistant from the two fixed electrodes in order to have two capacitors with an equal capacitance value. The common moving electrode can move some distance in the direction of one or other of the fixed electrodes under the action of a force. Thus the capacitive value of each capacitor varies inversely. The electronic interface circuit connected to the capacitive sensor thus enables an analogue output signal to be supplied. This analogue output signal takes the form of a voltage dependent on the capacitance variation of the two capacitors.

This electronic interface circuit for a capacitive sensor is disclosed in the article by Messrs H. Leuthold and F. Rudolph, which appeared in the journal entitled "Sensors and actuators" A21-23 (1990), pages 278 to 281.

The capacitive sensor may be an accelerometer for performing an acceleration measurement in conjunction with an electronic interface circuit. It may be a single axis accelerometer like the aforementioned capacitive sensor, or a multi-axis or tri-axis accelerometer for performing a measurement in three directions X, Y and Z. A tri-axis MEMS accelerometer of this type may include a single mass, i.e. a common inertial mass for the three pairs of differential capacitors, or three masses for the three pairs of capacitors. In the first case, a single common electrode and six fixed electrodes are provided, whereas in the second case, one common electrode with two fixed electrodes is provided for each pair of capacitors.

Both the electronic circuit and the capacitive sensor, such as a MEMS accelerometer, are made in a semiconductor substrate. Consequently, stray capacitances at the electronic circuit input are added to the capacitances of the capacitors of the MEMS capacitive sensor. These stray capacitances do not depend on the motion of the moving electrode, which consequently creates non-linearities and also lowers the sensitivity or gain of the electronic circuit. The same is true with the MEMS capacitive sensor, where the potential of the substrate during operation of the sensor also creates non-linearities. Thus, the measured electrostatic force is not zero in the sensor and electronic circuit in a rest mode. Because of the influence of the substrate potential on the electrostatic force, this leads to a variation in the measured real force, which is applied across the common moving electrode, which is a drawback.

To carry out a force, acceleration or pressure measurement using the electronic circuit, the fixed electrodes of two capacitors or pairs of capacitors are biased or excited cyclically by voltages of opposite polarity relative to an off reference voltage. By biasing or polarizing the two fixed electrodes at different voltage levels, the charge difference across the moving electrode can be measured and converted into at least one electronic circuit output voltage. When the output voltage or voltages are stabilised at their final value, the total charge across the moving electrode becomes zero. Consequently, these output voltages are supplied sampled to a processing circuit.

Since the measurement of a force, acceleration or pressure is dependent on the aforementioned non-linearities and on any offset voltage linked to unmatched electronic components, EP Patent Application No. 1 835 263 proposes a solution to this problem. A symmetrical double structure is proposed in the electronic circuit, particularly with two integrators following the charge transfer amplifier. Each integrator supplies a corresponding analogue output voltage at output according to positive electrode biasing or negative electrode biasing. Because of this, a voltage offset due to technology or to the variation in supply voltage can be minimised or eliminated using the two analogue integrator output voltages. Moreover, the substrate potential is no longer of any importance given that the electronic circuit includes an identical double structure operating in total symmetry.

However, one drawback of this type of electronic circuit of EP Patent Application No. 1 835 263 is that it supplies output signals, such as output voltages, in analogue form. This requires the use of two integrators. This means that it is not possible to sufficiently reduce the size of the integrated components and the electrical power consumption of the integrated electronic circuit. Moreover, the electronic circuit is only arranged to perform a measurement with one capacitive sensor along a single measurement axis.

It is thus preferred to make an electronic circuit which supplies digital measuring signals at output. WO Patent Application No. 2004/113930, which discloses an electronic circuit of this type connected to a single axis or multi-axis capacitive sensor for measuring acceleration, can be cited in this regard. A logic circuit specific to each measurement axis, which processes digital measuring signals, is provided after the charge transfer amplifier, which is connected to the common moving electrode. The output of each logic circuit supplies a binary measuring signal representative of a measuring voltage level dependent on the movement of the moving electrode relative to the fixed electrodes for each axis in succession. The binary measuring signal for each axis is supplied in succession to a digital-analogue converter. In one phase of each measuring cycle for a selected axis, this converter supplies a measuring voltage to the electrodes alternately with a phase of biasing the fixed electrodes at a high voltage and a low voltage from a supply voltage source. The binary signal obtained at the output of each logic unit is incremented or decremented by one unit at each series of measuring phases, until the total charge across the moving electrode becomes zero. Although the size of the electronic components and the electrical power consumption are reduced, the aforementioned non-linearities and voltage offsets are not removed, which is a drawback. Moreover, the stabilising time of the digital output signal for each measurement axis is relatively long, which is another drawback.

Like the preceding document, WO Patent Application No. 2008/107737 discloses an electronic interface circuit for a measuring acceleration sensor. An analogue measurement signal is stored after a charge transfer amplifier in one phase of a measuring cycle after the fixed electrodes of the capacitor have been biased. The analogue signal is converted into a digital signal stored in a logic unit of the electronic circuit. The stored digital signal is subsequently converted by a digital-analogue converter into an analogue return signal in the form of a voltage, which is applied to all the sensor electrodes in a successive phase of each measuring cycle. In a measuring cycle, the fixed electrodes are biased in succession by a first biasing and a second biasing which is the inverse of the first biasing. This enables leakage currents to be removed from the electronic circuit. However, a large number of steps are necessary to obtain a physical parameter measuring signal at output, which is a drawback.

EP Patent Application No. 2 343 507 A1 discloses an electronic interface circuit for a single axis or tri-axis measuring sensor. The measuring signals are digitally processed after the charge transfer amplifier in a logic unit. Following positive biasing and negative biasing digital measuring signals are stored in corresponding registers of the logic unit. A digital-analogue converter is also used for converting, in succession, the digital signals for each axis in a measuring cycle into a voltage at the sensor electrodes. To obtain final measurement values for the acceleration for each axis, a dichotomy algorithm is first of all used in the logic unit for a certain number of measuring cycles, prior to ending with oversampling steps. With this dichotomy algorithm, the measurement always starts, during each conversion, at half the measurement range, in particular at $V_{REG}/2$. If an error occurs during this first measurement with a large change step in the logic unit, the final value at the end of all the measuring cycles will inevitably be erroneous, which is a drawback.

SUMMARY OF THE INVENTION

It is thus an object of the invention to overcome the aforementioned drawbacks of the prior art by providing a method of measuring a physical parameter by means of an electronic interface circuit connected to a capacitive sensor, which can quickly supply precise output signals without any errors while also removing any voltage offset.

The invention therefore concerns a method of measuring a physical parameter by means of an electronic interface circuit connected to a capacitive sensor, which includes at least two differential connected capacitors whose a common electrode is capable of moving relative to each fixed electrode of the two capacitors to alter the capacitive value of each capacitor when the physical parameter is being measured, said electronic circuit including a charge transfer amplifier, which is connected to the common electrode via a switching unit, a logic unit connected to the amplifier output for digital processing of the data supplied by the amplifier and for supplying digital measuring signals, and a digital-analogue converter capable of supplying a measurement voltage to the electrodes via the switching unit, the measurement voltage being defined on the basis of a binary word conversion defining at least one of the digital measuring signals, the method including several successive measuring cycles for a measurement conversion, wherein each successive measuring cycle comprises the steps of:

a) biasing the electrodes of the capacitors via the switching unit with a measuring voltage supplied by the digital-analogue converter on the basis of a first digital measuring signal from a preceding cycle or a first initial binary word supplied by the logic unit, the first digital signal depending on a first biasing of the fixed electrodes of the capacitors, b) connecting the fixed electrodes of the capacitors via the switching unit respectively each to the terminals of a supply voltage source for a first biasing of the fixed electrodes, c) biasing the electrodes of the capacitors via the switching unit with a measuring voltage supplied by the digital-analogue converter on the basis of a second digital measuring signal from a preceding cycle or a second initial binary word supplied by the logic unit, the second digital signal depending on a second biasing which is the reverse of the first biasing of the fixed electrodes of the capacitors, d) connecting the fixed electrodes of the capacitors via the switching unit respectively each to the terminals of a supply voltage source for a second biasing of the fixed electrodes, which is the inverse of the first biasing, wherein the method starts each conversion with a first series of successive measuring cycles, in which the first and second digital signals are adapted in the logic unit to each measuring cycle by adding or subtracting a first determined step value greater than 2 on the basis of data supplied by the charge transfer amplifier and with a second series of successive measuring cycles after the first series of measuring cycles, in which the first and second digital signals are adapted in the logic unit to each measuring cycle by adding or subtracting a second determined step value equal to 1 or 2, until the end of the measurement conversion Particular steps of the measuring method are defined in the dependent claims 2 to 7.

One advantage of the measuring method lies in the fact that at least one digital output signal for a physical parameter measurement can be quickly supplied at the electronic circuit output without any errors. The measuring method provides a good compromise between the speed of change for example of an acceleration, and of the supply of measuring signals, and the reduction in noise by means of small adapting steps at the end of each conversion.

Another advantage of the measuring method lies in the fact that, straight away at the end of each conversion, the last digital signal stored in each corresponding register can be used again in order to start a subsequent measuring conversion. To start a new conversion, it is also possible to use a final mean of the successive digital signals stored in a corresponding register in at least a final part of a second series of measuring cycles with small adapting steps. A selection of the last digital value stored for each digital signal or of the mean of the digital signals of the second series of measuring cycles can be calculated on the basis of a count by a decision counter.

Advantageously, taking the preceding digital value from the positive biasing register and from the negative biasing register for each measurement axis, means that the variation in the preceding conversion and therefore also the preceding offset can be stored. There is therefore no longer any need to have a first series with a large number of measuring cycles with large adapting steps. However, allowance must be made for a good compromise between abrupt changes in the physical parameter to be measured and noise reduction, which is achieved with a second series of small steps in the measuring cycles.

The invention therefore also concerns an electronic interface circuit for a capacitive sensor, which includes a pair of differential connected capacitors for implementing the measuring method according to any of the preceding claims, the electronic circuit including a charge transfer amplifier connected to the common electrode via a switching unit, a logic unit connected to the amplifier output for digital processing of the data supplied by the amplifier and for supplying first and second digital measuring signals, dependent respectively on a first biasing of the fixed electrodes of the capacitors and a second biasing which is the reverse of the first biasing, and a digital-analogue converter capable of supplying a measuring voltage to the electrodes via the switching unit, the measuring voltage being defined on the basis of a binary word conversion relating to the first digital signal stored in a first register of the logic unit or the second digital measuring signal stored in a second register of the logic unit, wherein the logic unit includes an element for calculating a mean connected to the registers, said element being intended to calculate a mean of the first successive digital signals and a mean of the second successive digital signals in at least part of the second series of measuring cycles of a conversion, and a decision counter capable of counting or counting down according to the output state of the charge transfer amplifier for each measuring cycle of a conversion, the decision counter being intended to order the selection of the last digital value of the first digital signal and of the second digital signal at the end of a conversion, if the count or countdown of successive identical states exceeds a predetermined threshold, or the selection of the mean of the first digital signals and the mean of the second digital signals to be stored in the registers if the count or countdown threshold of the decision counter is not exceeded, for a subsequent conversion.

Specific embodiments of the electronic circuit are defined in the dependent claims 9 to 11.

One advantage of the physical sensor electronic interface circuit lies in the fact that it can quickly provide stabilised digital measuring signals at output owing to digital processing immediately after the charge transfer amplifier. These digital measuring signals are processed in the logic unit. These digital signals are adapted from the first measuring cycles by first of all using large adapting steps, which may be programmed, followed by small adapting steps at the end of each measurement conversion. Two digital signals depending on positive biasing and negative biasing of the fixed electrodes of the pair of capacitors are provided in the logic unit. By combining the digital signals this enables any voltage offset to be removed from the electronic circuit components.

Another advantage of the electronic interface circuit for a physical sensor lies in the fact that it can provide digital signals for each axis of a tri-axis sensor. A single amplifier, a logic unit and a single digital-analogue converter are thus provided for measuring the physical parameter on the three axes. This limits redundancy in the electronic circuit.

BRIEF DESCRIPTION OF THE DRAWINGS

The objects, advantages and features of the method of measuring a physical parameter and the electronic interface circuit for a capacitive sensor for implementing the same will appear more clearly in the following description with reference to the drawings, in which.

DETAILED DESCRIPTION OF THE INVENTION

Since various components of the sensor electronic interface circuit with differential capacitors are well known in this technical field, they will not all be explained in detail in the following description. Emphasis is mainly placed on the method of measuring a physical parameter by means of an electronic circuit which supplies digital measuring signals at output.

Figure 1:
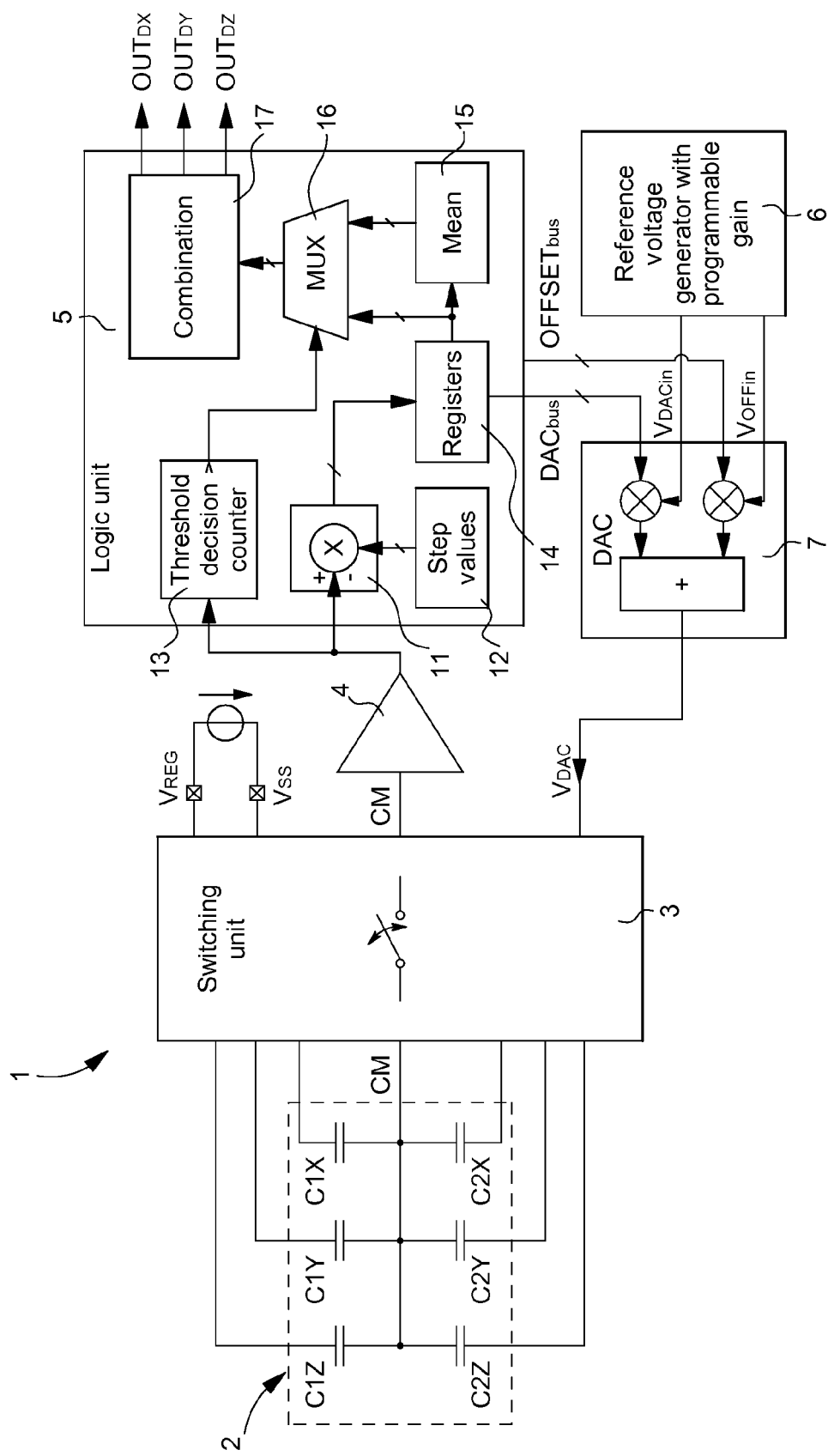
FIG. 1 shows a simplified view of an electronic interface circuit connected to a capacitive sensor for implementing the method of measuring a physical parameter according to the invention.

FIG. 1 shows a simplified diagram of the various components of electronic interface circuit 1 for a capacitive sensor 2 according to the invention. In this embodiment, a tri-axis capacitive MEMS sensor 2 with a single mass is connected to electronic circuit 1, although it is entirely possible to envisage connecting a tri-axis sensor with three moving masses or a single axis sensor. This capacitive sensor is thus formed of three pairs of capacitors C1X, C2X, C1Y, C2Y, C1Z and C2Z. The two capacitors of each pair are differential connected. A common electrode CM of the pairs of capacitors can move under the action of a force between two fixed electrodes of each pair of capacitors to make a measurement taking account of the three axes X, Y and Z.

Electronic circuit 1 can supply digital measuring signals for each axis, which relate to a physical parameter, such as an acceleration, angular speed, pressure or force, as a function of the movement of the common moving electrode. In the case of an acceleration measurement, the electronic circuit can be configured to supply digital measuring signals between minimum and maximum acceleration values. One may choose, for example, to configure the electronic circuit to supply digital measuring signals within the acceleration range of −2 g to +2 g. A voltage variation of around 3 to 20 mV may be allowed for 1 g of acceleration.

Moving common electrode CM may form part of the armature of a sensor resiliently held in a central position at rest between the two fixed electrodes of each pair of capacitors C1X, C2X, C1Y, C2Y, C1Z and C2Z. Electronic circuit 1 may be powered by a continuous supply voltage source (not shown). This supply voltage source supplies a regulated high voltage $V_{REG}$ at a first terminal and a low voltage $V_{SS}$ at a second terminal. The low voltage can be defined at 0 V, whereas the regulated high voltage can be set at 1.65 V for example. The fixed electrode of each capacitor can be biased in a measuring cycle phase, either at high voltage $V_{REG}$ or at low voltage $V_{SS}$ in an operating mode of the electronic circuit. Consequently, since the two capacitors C1X, C2X, C1Y, C2Y, C1Z and C2Z of each pair have an equal capacitive value when sensor 2 is at rest, the voltage across common electrode CM is preferably equal at rest to an intermediate voltage $V_{REG}/2$ between regulated voltage $V_{REG}$ and low voltage $V_{SS}$ at 0 V.

The digital measuring signals supplied by electronic circuit 1 are proportional for two capacitors C1 and C2 at (C1−C2)/(C1+C2). Once the digital measuring signals have stabilised at a final physical parameter measurement at the end of each conversion, any charge flow across the two capacitors of each pair is cancelled out. Thus the object of the electronic circuit consists in finding a voltage to apply across each fixed electrode in a charge equalising phase, on the basis of a preceding digital signal, which satisfies $(V_{REG}-V_{DAC})\cdot C1=(V_{DAC}-V_{SS})\cdot C2$. This is achieved when $V_{DAC}=(V_{REG}/2)\cdot(1+(C1-C2)/(C1+C2))$.

Electronic circuit 1 includes a comparator type charge transfer amplifier 4, which is directly connected to moving electrode CM of the capacitors via a switching unit 3. Switching unit 3 receives voltages $V_{REG}$, $V_{SS}$ and $V_{DAC}$ to be applied to the sensor electrodes in accordance in the measuring cycle phases. Regulated voltage $V_{REG}$ and low voltage $V_{SS}$ are applied to the fixed electrodes, whereas voltage $V_{DAC}$, from a digital-analogue converter 7 in inverse feedback, is applied to all the electrodes. Each measuring cycle alternates between a phase where all the electrodes receive a voltage $V_{DAC}$ from a preceding measurement and a phase of biasing the fixed electrodes between $V_{REG}$ and $V_{SS}$.

To understand how the voltages are applied to the electrodes during each measuring cycle and for the three measurement axes, reference is made to EP Patent Application No. 2 343 507 A1 which is incorporated herein by reference. In this regard, all the voltages are explained with reference to FIG. 2 of that Patent Application, and described in paragraphs 40 to 48. In each first measuring half cycle, there is successive positive biasing of the fixed electrodes for each measurement axis, alternately with voltage $V_{DAC}$ supplied to all the electrodes and which relates to a first preceding digital measuring signal of the positive biasing for each measurement axis. Positive biasing may be the first biasing of the fixed electrodes. In each second measuring half cycle, there is successive negative biasing of the fixed electrodes, alternately with voltage $V_{DAC}$ supplied to all the electrodes and which relates to a second previous digital measuring signal of the negative biasing for each measurement axis. Negative biasing may be the second biasing. The positive biasing between $V_{REG}$ and $V_{SS}$ is the inverse of the negative biasing.

It is to be noted that it is also possible to envisage performing the steps of positive biasing and negative biasing of the sensor electrodes alternately with voltage $V_{DAC}$ of the first and second digital signals for each axis in succession.

Each acceleration measuring cycle has 12 phases, comprising 3 positive biasing phases for each measuring axis, and 3 negative biasing phases, for a tri-axis sensor, whereas simply 4 phases are sufficient for a single axis sensor. Further, several successive measurement cycles are necessary to obtain the final digital measuring values for each axis of each conversion as explained below. For each conversion, 16, 32, 40 or 64 successive measurement cycles may, for example, be carried out. However, unlike the succession of measurement cycles presented in the above Patent Application, every conversion of the measuring method according to the invention does not start in the middle of the measurement range at $V_{REG}/2$. Each conversion starts by taking account of the preceding digital value stored from a previous conversion respectively for each measurement axis and for positive biasing and for negative biasing.

Comparator amplifier 4 is of very simple design of the type disclosed in the article entitled "A 1 mV MOS Comparator" in the journal IEEE, J. Solid-State Circuits, vol. SC-13. pp. 294-298 of June 1978. This comparator amplifier 4 generally includes a capacitor at input connected to common electrode CM, followed by amplifier stages for supplying an all-or-nothing digital signal at output. This charge transfer amplifier has a very high gain. The amplifier output signal is at the "1" state close to regulated voltage $V_{REG}$ when the voltage across moving electrode CM increases via the accumulation of positive charges in the measuring cycles. However, the amplifier output signal changes to the "0" state close to low voltage $V_{SS}$ when the voltage across moving electrode CM decreases via the accumulation of negative charges in the measuring cycles.

Electronic circuit 1 also includes a logic unit 5, which includes storage means, which store, in particular, various configuration parameters, and mainly the measuring algorithm of the method of the invention. Logic unit 5 of the electronic circuit further includes a processor (not shown) which is clocked by a conventional clock signal, so as to control performance of all the necessary steps of the physical parameter measuring method, particularly for an acceleration.

Logic unit 5 further includes at least one counter 13 connected to the processor, and several registers 14 for storing digital signals in the form of binary measuring words for each measurement axis. There are two registers per measurement axis. Thus for measuring an acceleration with a tri-axis sensor, logic unit 5 has six registers for the three measurement axes. For each axis, a first register receives a first digital measuring signal from a defined positive biasing (pol at "0") of the fixed electrodes of the corresponding pair of capacitors, whereas a second register receives a second digital measuring signal from a defined negative biasing (pol at "1") of the fixed electrodes of the corresponding pair of capacitors. Negative biasing is simply a reverse biasing of the positive biasing.

During each measuring cycle, the first digital signal and the second digital signal for each axis stored in a corresponding register, are incremented or decremented by a certain digital value according to a determined programmed step. To achieve this, logic unit 5 includes a multiplication element 11, which receives the output signal from comparator amplifier 4, and a digital value of an element 12 supplying a step value. If the output of comparator amplifier 4 is in the high state "1", this means an increase in voltage across moving electrode CM. In these conditions, the multiplication element 11 multiplies the digital step value by +1 in order to add the digital step value to the preceding digital signal stored in the corresponding register 14. Conversely, if the output of comparator amplifier 4 is in the low state "0", this means a decrease in voltage across moving electrode CM. In these conditions, multiplication element 11 multiplies the digital step value by −1 in order to subtract the digital step value from the preceding digital signal stored in the corresponding register 14.

In a first series of measuring cycles of each conversion, large programmed digital step values are supplied by step value supply element 12. These first large digital values can be programmed for example to have a value of 32 or 64 or another large value on a scale of 0 to 1023 for each 10-bit binary word. Each binary word may be in more than 10 bits or fewer bits according to the intended application of the electronic circuit with the capacitive sensor. These large digital values may thus be added to or subtracted from a preceding digital signal stored in the corresponding register. For the first measuring cycles of each conversion, it is possible for a large step value to be added to or subtracted from the preceding digital value of a corresponding register for 2 to 8 first measuring cycles. Following, for example, these 2, 4, 6 or 8 first measuring cycles, a second series of measuring cycles is carried out until the end of each conversion, in which a small programmed digital step value is added to or subtracted from the digital signal of a corresponding register 14. This is carried out for the 6 registers in succession. This small digital step value may advantageously be chosen to be 1 or 2 according to the noise to be taken into account.

The duration of each measurement conversion for the three measurement axes may be less than 1,500 μs if each phase has a duration of around 2 μs or less. Of course, this duration also depends on the number of samples taken for each axis and each positive or negative biasing.

For each measuring cycle, in which 16, 32, 40 or 64 successive measuring cycles may be provided, it is possible to calculate a mean of all the successive digital signals stored in a corresponding register in at least a final part of the second series of measuring cycles. At least 8, 10 or 12 or more samples of successive digital signals stored in logic unit 5 in the last measuring cycles are used to calculate the mean. This mean is calculated via a mean calculation element 15 connected to registers 14. A particular memory connected to mean element 15 can store all the successive digital signals of a corresponding register. This mean of the results of the second series of measuring cycles may of course be calculated, except if there is only a continual increase or a continual decrease per small step value of the digital signal of a corresponding register in most of the measuring cycles.

Logic unit 5 further includes decision counter 13, which is used in the second series of measuring cycles of each conversion, to detect whether the output signal of comparator amplifier 4 is continually in state "1" or state "0" in each successive measuring cycle. If the number of "1"s or "0" counted one after the other by counter 13 exceeds a predetermined threshold, counter 13 supplies a command signal to a multiplexer 16 for the last digital signal stored in the corresponding register to be supplied to the multiplexer output. This threshold can be defined by taking account of the number of cycles of the second series of measuring cycles. If there are more than 50 cycles in the second series of measuring cycles, the threshold of decision counter 13 may be set, for example, at 8 cycles or 30 cycles or 40 cycles or another value.

If the number counted by the decision counter does not exceed the threshold, multiplexer 16 supplies at output the mean of the various digital signals stored in the second series of measuring cycles, which is supplied by mean element 15. At the end of each conversion, by combining or adding two registers per measurement axis in a combination element 17 connected to multiplexer 16, logic unit 5 supplies a digital output signal $OUT_{DX}$, $OUT_{DY}$, $OUT_{DZ}$. Any offset voltage has been removed from these combined output signals for each axis.

It is to be noted that at the end of each conversion, either the last digital signal of each register, or the stored mean of various digital signals in the second series of measuring cycles is used for a new conversion. This advantageously means that advantage can be taken of preceding value variations in previous conversions while storing the preceding offset. In these conditions, it is no longer necessarily required to carry out several first cycles of adding or subtracting large step values for all the subsequent conversions. With the second series of measuring cycles, adding or subtracting a small step value can reduce the effects of noise.

It is also to be noted that at the start of each measurement conversion in the first series of measuring cycles, the large step value to be added to or subtracted from the digital signal stored in the corresponding register can be modified in the same conversion or from one conversion to the next. The large step value can be gradually increased or decreased from the start of the first series of measuring cycles or the number of measuring cycles of the first series may be larger or smaller from one conversion to the next.

Each digital measuring signal or binary word DACbus stored in registers 14 is supplied in succession in each measuring cycle to a DAC digital-analogue converter 7 so as to convert each binary word DACbus into an output voltage $V_{DAC}$. As explained above this DAC output voltage allows all of capacitors C1X, C2X, C1Y, C2Y, C1Z, C2Z and CM to be discharged in one of the measuring cycle phases to a voltage value which depends on the binary word DACbus of a particular axis. Binary word DACbus is multiplied in a first multiplier in digital-analogue analogue converter 7 by a reference voltage $V_{DACin}$, which comes from a reference voltage generator with a programmable gain 6. This reference voltage can be supplied by means of a resistive divider connected between regulated voltage $V_{REG}$ and earth $V_{SS}$.

Logic unit 5 also supplies a binary adjusting word OFFSETbus (10 bits) for an offset voltage relating to the MEMS sensor at input. This binary adjusting word OFFSETbus is multiplied in a second multiplier in digital-converter 7 with an adjusting voltage $V_{OFFIn}$, which comes from programmable gain reference voltage generator 6. This adjusting voltage $V_{OFFIn}$ can also be obtained by means of a resistive divider connected between regulated voltage $V_{REG}$ and earth $V_{SS}$. The output voltages of the two multipliers of converter 7 are then added so that the digital-analogue converter supplies voltage $V_{DAC}$ at output. As will be seen below, the voltage offset linked to the MEMS sensor does not depend on the biasing applied to the fixed electrodes of the capacitor pairs. A preliminary calibrating step for correcting this MEMS sensor voltage offset can be performed once and for all before the physical parameter is measured by electronic circuit 1.

Since binary words DACbus and OFFSETbus may be in 10 bits from 0 to 1023, it is possible to express output voltage $V_{DAC}$ from a positive biasing (polarity "0") of the fixed electrodes on the one hand and from a negative biasing (polarity "1") of the fixed electrodes on the other hand. These two equations eq(0) and eq(1) of the two voltages $V_{DAC}$ are expressed as follows:

$$V_{DAC}(0)=V_{REG}/2+V_{DACoffset}+(DACbus(0)-512) \cdot K_{DAC} \cdot V_{REG}+(OFFSETbus-512) \cdot K_{OFF} \cdot V_{REG} \qquad eq(0):$$

$$V_{DAC}(1)=V_{REG}/2+V_{DACoffset}-(DACbus(1)-512) \cdot K_{DAC} \cdot V_{REG}-(OFFSETbus-512) \cdot K_{OFF} \cdot V_{REG} \qquad eq(1):$$

$K_{DAC}$ is a factor that defines the system gain. This gain can be programmable for example by generating a voltage $V_{DACin}$ which comes from a resistive divider of the reference voltage generator 6. $K_{OFF}$ is a factor which defines the gain of the adjusting circuitry of the MEMS sensor voltage offset. This gain can be adapted in accordance with the desired adjusting range for example by generating a voltage $V_{OFFIn}$ which comes from another resistive divider of the reference voltage generator 6. DACbus(0) defines the 10-bit binary word which comes from a first register of logic unit 5, which is applied to DAC converter 7 during the positive biasing phases. This binary word is defined from 0 to 1023. DACbus(1) defines the 10-bit binary word which comes from a second register of logic unit 5, which is applied to DAC converter 7 during the negative biasing phases. This binary word is defined from 0 to 1023. OFFSETbus defines the 10-bit binary adjusting word which is applied to DAC converter 7 to correct the voltage offset linked to the MEMS sensor. $V_{DACoffset}$ represents the stray voltage offset of DAC converter 7 which it is desired to remove. This stray voltage offset covers any voltage offset linked to the electronic circuit (amplifier, converter, . . . ), and may also represent the flicker noise frequency.

It is also to be noted that DACbus(0) may be different from DACbus(1) if an acceleration is being measured, since these binary words depend on the state of biasing applied to the fixed electrodes. However, OFFSETbus does not depend in any way on the biasing applied to the fixed electrodes. Thus OFFSETbus is selected permanently after the preliminary step of calibrating the MEMS sensor linked to the electronic circuit as indicated above. This binary adjusting word can be stored in the storage means of logic unit 5. If the MEMS sensor needs a voltage variation $V_{MEMS}$ around $V_{REG}/2$ in order to balance the charges, equations eq(0) and eq(1) take the following form:

$$V_{REG}/2 + V_{MEMS} = V_{REG}/2 + V_{DACoffset} + (\text{DACbus}(0) - 512) \cdot K_{DAC} \cdot V_{REG} + (\text{OFFSETbus} - 512) \cdot K_{OFF} \cdot V_{REG} \quad \text{eq}(0)$$

$$V_{REG}/2 - V_{MEMS} = V_{REG}/2 + V_{DACoffset} - (\text{DACbus}(1) - 512) \cdot K_{DAC} \cdot V_{REG} - (\text{OFFSETbus} - 512) \cdot K_{OFF} \cdot V_{REG} \quad \text{eq}(1):$$

If capacitance C1X is greater than capacitance C2X for example, the charge balancing occurs at a higher voltage than $V_{REG}/2$ for the positive biasing and a lower voltage than $V_{REG}/2$ for a negative biasing. If these two equations eq(0) and eq(1) are subtracted, this gives the following equation eq(2):

$$2 \cdot V_{MEMS} = (\text{DACbus}(0) + \text{DACbus}(1) - 1024) \cdot K_{DAC} \cdot V_{REG} + 2 \cdot (\text{OFFSETbus} - 512) \cdot K_{OFF} \cdot V_{REG} \quad \text{eq}(2)$$

DACbus(0)+DACbus(1)−1024 is proportional to $V_{MEMS}$ which is also proportional to the acceleration. The term $V_{DACoffset}$ has disappeared from equation eq(2) which is the ultimate objective. The system gain thus depends on the choice of $K_{DAC}$. The MEMS sensor voltage offset can thus still be eliminated by proper selection of binary word OFFSETbus.

To better show the change in the digital signals for one or two successive conversions, reference may be made to FIGS. 2a, 2b, 3a, 3b and 4 relative to the measuring method according to the invention.

Figure 2A:
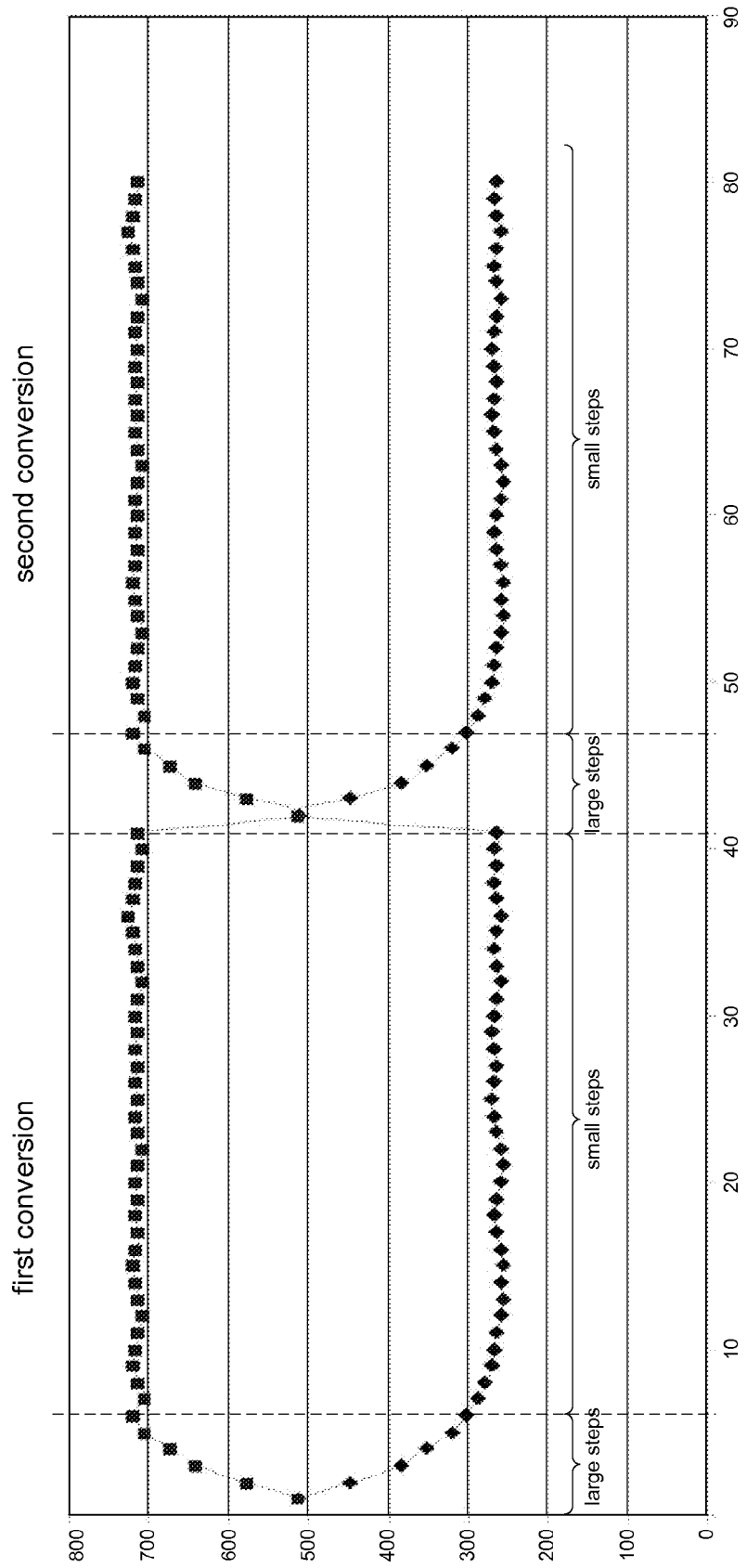
FIGS. 2a and 2b show comparative time diagrams on the one hand on one measuring axis starting from the middle of the measurement range for each successive measurement conversion, and on the other hand starting from the value of a preceding conversion where there is no acceleration and maximum offset of the measuring method according to the invention.

FIG. 2a shows two successive measurement conversions particularly for the case of a measurement for a single axis sensor. However, identical graphs may also be shown for the case of a measurement by a tri-axis sensor. The x axis represents the number of samples taken for the measurement following positive biasing and the measurement following negative biasing. One sample is obtained for each digital signal in one measuring cycle. The y axis represents the level of each digital signal.

The two measurement conversions are shown in a simplified manner in the case where there is no acceleration to be measured by the sensor, but where there is however a large offset from converter DAC to be taken into account. At the start of each conversion, the binary words of the positive biasing register and the negative biasing register are always reset to the middle of the measurement range, i.e. to 512 for a digital range from 0 to 1023. The negative biasing digital signal increases in each conversion from initialisation at 512, whereas the positive biasing digital signal decreases in each conversion from initialisation at 512. It is noted that the positive biasing digital signal values are spaced from the negative biasing digital signal values so as to compensate for the electronic circuit offset by combining the two digital signals.

It is clearly seen in FIG. 2a that each measurement conversion starts with a first series of measuring cycles with a large step value added to or subtracted from the previously stored digital signal. At the end of this first series of measuring cycles, for example after 6 measuring cycles, a second series of measuring cycles starts. In this second series, a small step value is added to or subtracted from the preceding digital signal stored in the corresponding register. At the end of each conversion, there is a reset to 512 for the next conversion after the combined digital signals have been supplied at the logic unit output at their last value. This method of resetting each conversion to the middle of the measurement range may prove disadvantageous if large changes in acceleration occur from one conversion to the next.

Figure 2B:
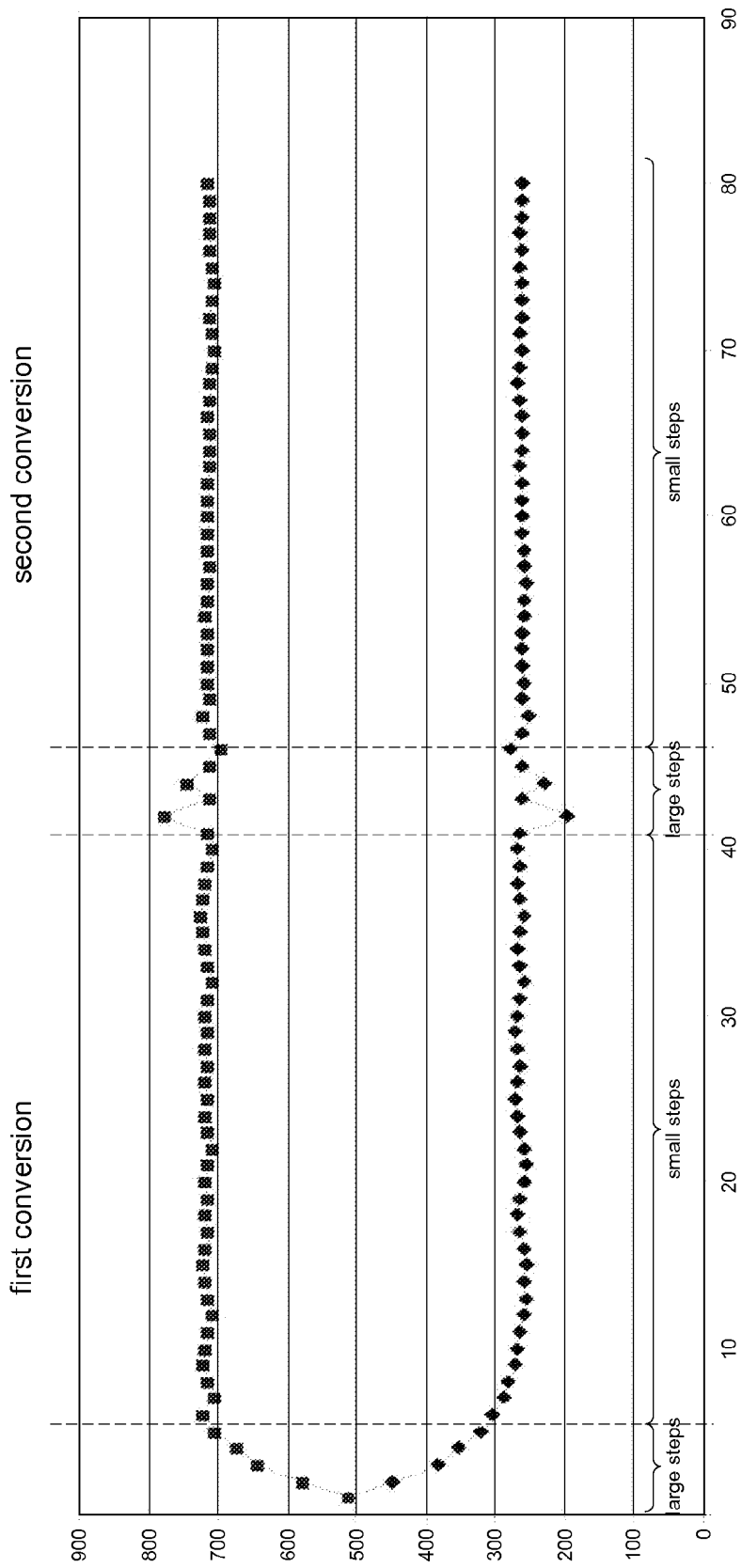

FIG. 2b also shows two successive measurement conversions particularly for the case of a measurement for a single axis sensor. The x axis represents the number of samples taken for the measurement following positive biasing and the measurement following negative biasing. One sample is obtained for each digital signal in one measuring cycle. The y axis represents the level of each digital signal.

The two measurement conversions are shown in a simplified manner in the case where there is no acceleration to be measured by the sensor, but where there is however a large offset from converter DAC to be taken into account. The first conversion, which starts at the initial value of 512, is identical to the first conversion of FIG. 2a. However, for the second conversion, the last digital signal from the corresponding register is used to start the first series of measuring cycles. In this case it is also possible to use the mean of the digital signals stored in succession in the corresponding register, in at least most of the second series of measuring cycles, to start the first series of measuring cycles of the second conversion. Thus each digital signal shown remains close to its stable state value, but the first series of measuring cycles is still performed with a large step value.

Figure 3A:
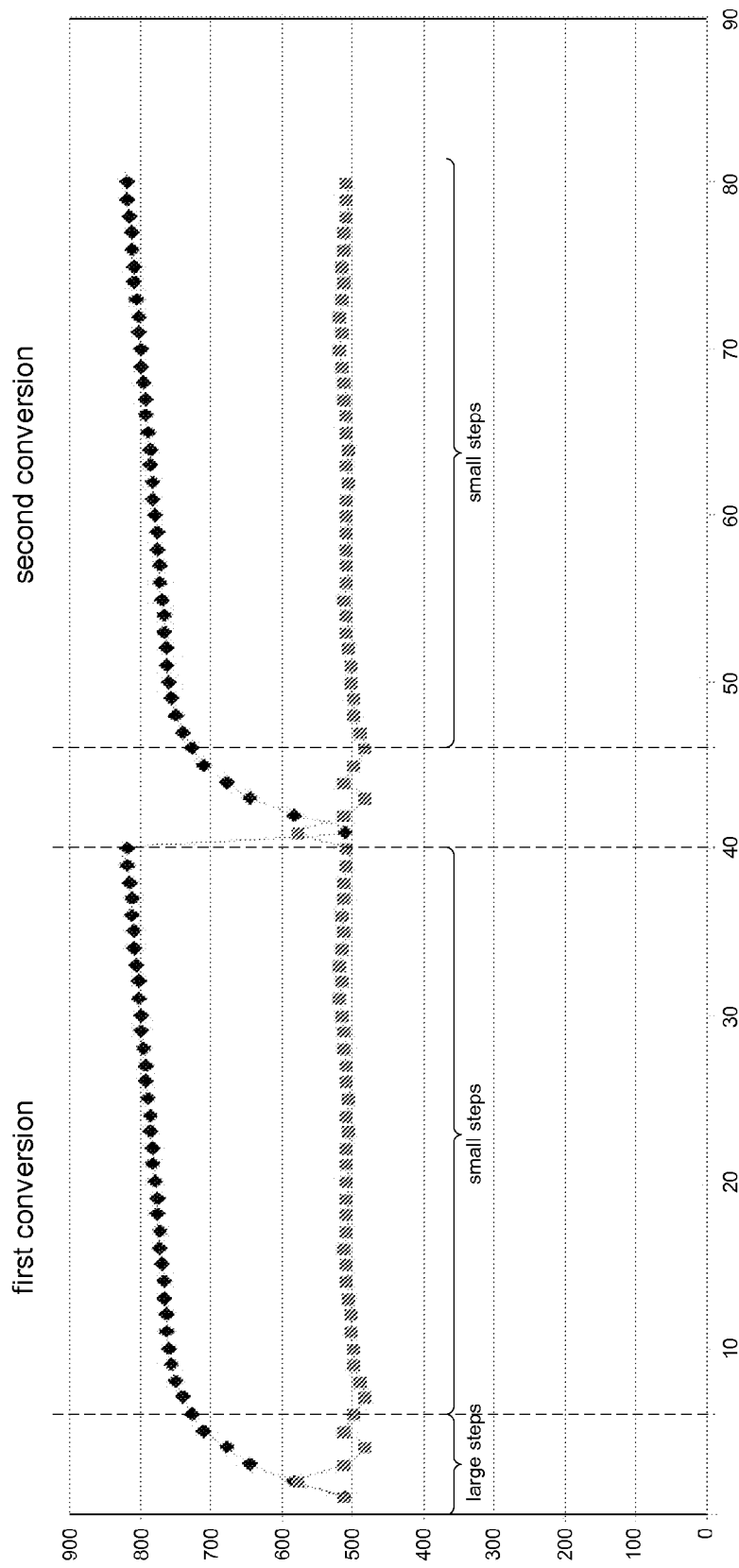
FIGS. 3a and 3b show comparative time diagrams on one measuring axis on the one hand starting from the middle of the measurement range for each successive measurement conversion, and on the other hand starting from the value of a preceding conversion where there is maximum acceleration and maximum offset of the measuring method according to the invention.

FIG. 3a shows two successive measurement conversions particularly for the case of a measurement for a single axis sensor. The x axis represents the number of samples taken for the measurement following positive biasing and the measurement following negative biasing. One sample is obtained for each digital signal in one measuring cycle. The y axis represents the level of each digital signal.

The two measurement conversions are shown in a simplified manner for the case where there is a large acceleration for the sensor to measure and a large DAC converter offset. The large acceleration to be measured must in principle cause one of the digital signals to tend towards a maximum value of 1000. At the start of each conversion, the binary words of the positive biasing register and the negative biasing register are always reset to the middle of the measurement range, i.e. to 512 for a digital range from 0 to 1023.

As shown, the negative biasing digital signal has a tendency to remain close to the middle of the measuring range around 500, whereas the positive biasing digital signal increases to approach the desired maximum value. However, it is noted that since there has been an initialisation to the middle of the measuring range at the start of each conversion, the positive biasing digital signal never manages to reach the maximum value of the desired acceleration target. In this case, the number of cycles in the first series of measuring cycles or the large step value to be added in the first measuring cycles, which has a tendency to generate more noise, should be increased The second series of measuring cycles with a small added or subtracted step value is still necessary in order to reduce output noise. A large variation due to the offset and a sharp acceleration leads to an excessively large change notably in the digital positive biasing signal.

Figure 3B:
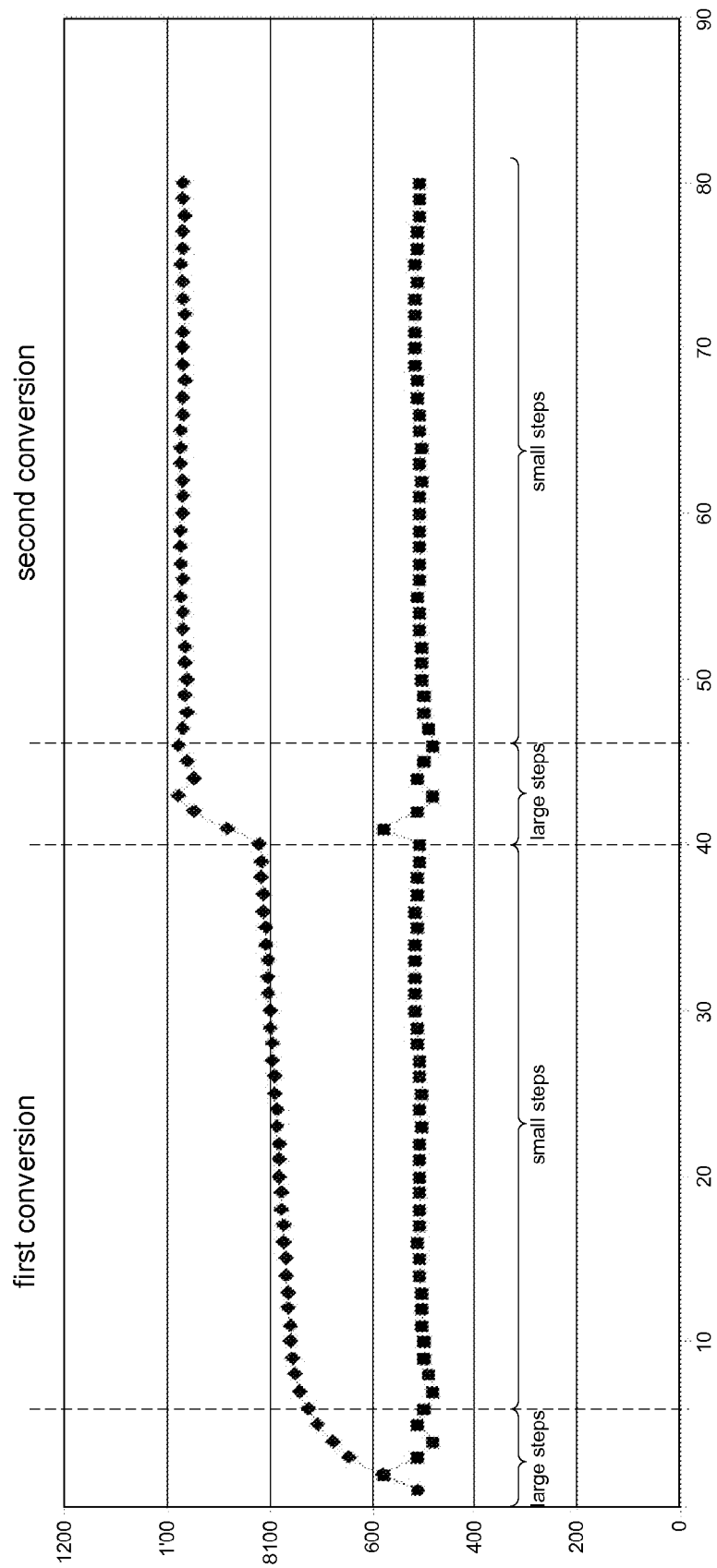

FIG. 3b shows two successive measuring conversions particularly for the case of a measurement for a single axis sensor. The x axis represents the number of samples taken for the measurement following positive biasing and the measurement following negative biasing. One sample is obtained for each digital signal in one measuring cycle. The y axis represents the level of each digital signal.

The two measurement conversions are shown in a simplified manner for the case where there is a large acceleration for the sensor to measure and a large DAC converter offset. The first conversion, which starts at the initial value of 512, is identical to the first conversion of FIG. 3a. However, for the second conversion, the last binary word of the digital signal from the corresponding register is used to start the first series of measuring cycles.

As for the first conversion, the positive biasing digital signal never reaches the desired target of 1000 in each measuring cycle of the second series of measuring cycles, a continual increase occurs in each cycle. Consequently, it is the last binary word which is used to start the second conversion. With the second conversion, it is noted that starting from the preceding value of the positive biasing digital signal, the last binary word of said digital signal is close to the target acceleration value of around 1000. The re-use of the preceding digital signal value with the same algorithm means that the offset is removed more efficiently as a result of the storage. This also decreases the number of steps required to achieve proper convergence and/or to reduce the noise across the final calculated output.

Starting from the preceding value of the digital signal for the second conversion, it is possible to calculate the mean of at least part of the digital signals successively stored in the corresponding register in the second series of measuring cycles. This mean may then be stored in the register of the positive biasing digital signal, to start a third conversion (not shown).

Figure 4:
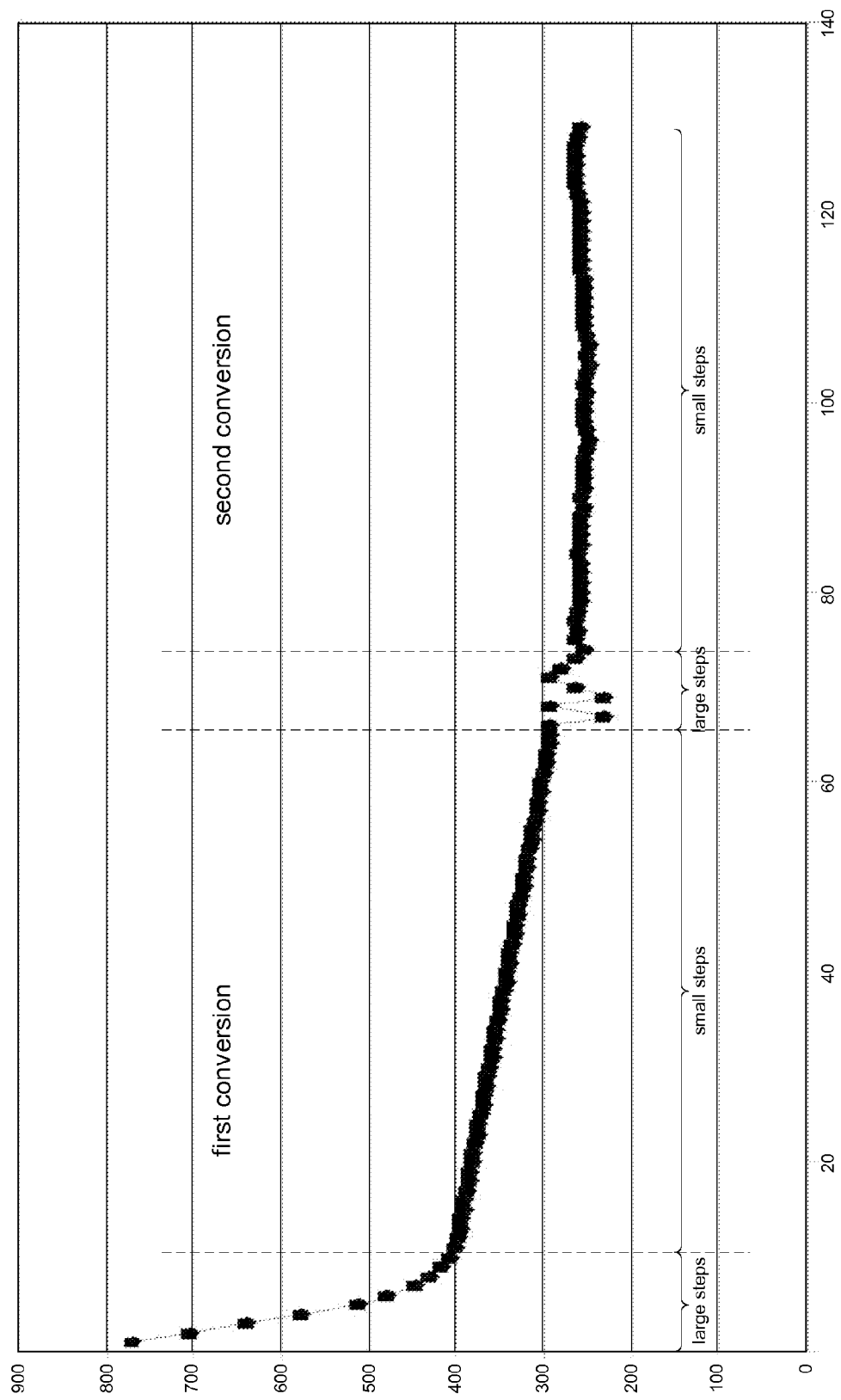
FIG. 4 shows a time diagram on one measuring axis of a maximum change in acceleration between two successive measurement conversions taking account of the zero offset of the measuring method according to the invention.

FIG. 4 shows by way of example a negative biasing digital signal with a maximum acceleration change between two successive measurement conversions assuming zero offset for the measuring method according to the invention. The first conversion starts at a maximum value of the negative biasing digital signal, i.e. close to 800. The expected target value is close to 250, which represents a large acceleration change. As shown in FIG. 3a, the digital signal for this negative biasing does not attain the target value of 250 at the end of the first conversion. The last digital signal stored in the corresponding register is taken into account to start the second conversion. In this second conversion, it is noted that the target value of 250 is reached at the end of the second conversion. A mean can be calculated of at least part of the digital signals stored in succession in the corresponding register in the second series of measuring cycles. This mean may then be subsequently stored in the register of the negative biasing digital signal, to start a third conversion (not shown).

From the description that has just been given, multiple variants of the method of measuring a physical parameter and the electronic interface circuit for the capacitive sensor for implementing the same can be devised by those skilled in the art without departing from the scope of the invention defined by the claims. It is possible to envisage altering the duration of each phase in relation to the other, or the duration of each cycle during the physical parameter measuring operations, as well as the number of successive measuring cycles for each measurement conversion. The order of the positive and negative biasing can be altered in each measuring cycle. At least two additional phases of the electronic circuit function test can also be placed in each measuring cycle.

What is claimed is:

1. A method of measuring a physical parameter by means of an electronic interface circuit connected to a capacitive sensor, which includes at least two differential connected capacitors whose a common electrode is capable of moving relative to each fixed electrode of the two capacitors to alter the capacitive value of each capacitor when the physical parameter is being measured, said electronic circuit including a charge transfer amplifier, which is connected to the common electrode via a switching unit, a logic unit connected to the amplifier output for digital processing of the data supplied by the amplifier and for supplying digital measuring signals, and a digital-analogue converter capable of supplying a measurement voltage to the electrodes via the switching unit, the measurement voltage being defined on the basis of a binary word conversion defining at least one of the digital measuring signals, the method including several successive measuring cycles for a measurement conversion, wherein each successive measuring cycle comprises the steps of:
a) biasing the electrodes of the capacitors via the switching unit with a measuring voltage supplied by the digital-analogue converter on the basis of a first digital measuring signal from a preceding cycle or a first initial binary word supplied by the logic unit, the first digital signal depending on a first biasing of the fixed electrodes of the capacitors,
b) connecting the fixed electrodes of the capacitors via the switching unit respectively each to the terminals of a supply voltage source for a first biasing of the fixed electrodes,
c) biasing the electrodes of the capacitors via the switching unit with a measuring voltage supplied by the digital-analogue converter on the basis of a second digital measuring signal from a preceding cycle or a second initial binary word supplied by the logic unit, the second digital signal depending on a second biasing which is the reverse of the first biasing of the fixed electrodes of the capacitors,
d) connecting the fixed electrodes of the capacitors via the switching unit respectively each to the terminals of the supply voltage source for a second biasing of the fixed electrodes, which is the inverse of the first biasing,
wherein the method starts each conversion with a first series of successive measuring cycles, in which the first and second digital signals are adapted in the logic unit to each measuring cycle by adding or subtracting a first determined step value greater than 2 on the basis of data supplied by the charge transfer amplifier and with a second series of successive measuring cycles after the first series of measuring cycles, in which the first and second digital signals are adapted in the logic unit to each measuring cycle by adding or subtracting a second determined step value equal to 1 or 2, until the end of the measurement conversion.

2. The measuring method according to claim 1, wherein the logic unit includes a first register for storing the first digital measuring signal in 10 bits, and a second register for storing the second digital measuring signal in 10 bits, wherein each measurement conversion starts on the basis of a final digital value for each digital signal stored in the first register and the second register from a preceding conversion.

3. The measuring method according to claim 1, wherein a mean is calculated of the digital signals stored in succession in the logic unit in at least a final part of the successive measuring cycles of the second series of measuring cycles, in order to store the mean of each digital signal as the final digital value in the corresponding register to be supplied to start a subsequent conversion.

4. The measuring method according to claim 1, wherein the logic unit includes a decision counter capable of counting or counting down in succession according to the state of the charge transfer amplifier output in each measuring cycle in the second series of successive measuring cycles, so as to detect a continual increase or a continual decrease in each digital signal, wherein in the second series of measuring cycles, the last digital value stored for each digital signal is selected as the final digital value at the end of the conversion to be supplied for a subsequent conversion, if the decision counter has counted or counted down, in successive measuring cycles, a higher number of identical output states of the charge transfer amplifier than a predetermined threshold.

5. The measuring method according to claim 4, wherein the decision counter counts or counts down a number of successive identical output states of the charge transfer amplifier higher than a threshold equal to 8, to select the last digital value stored for each digital signal as the final digital value.

6. The measuring method according to claim 1, wherein the capacitive sensor is of the tri-axis type with three pairs of differential connected capacitors with one common electrode per pair or for all the pairs and two fixed electrodes for each pair, and the logic unit of the electronic circuit is capable of supplying first and second digital measuring signals for each measuring axis X, Y and Z, wherein the method includes 12 successive phases per measuring cycle, which consist in repeating steps a) and b) in succession during the first six phases for each axis X, Y, Z with the first digital signal corresponding to the selected axis, and in repeating steps c) and d) in succession during the last six phases for each axis X, Y, Z with the second digital signal corresponding to the selected axis.

7. The measuring method according to claim 1, wherein 16, 32, 40 or 64 measuring cycles are carried out in each measurement conversion, and wherein the first series of successive measuring cycles includes between 2 and 8 measuring cycles with a first step value equal to 32 or 64 on a scale from 0 to 1023 for each 10-bit binary word of the digital signals.

8. An electronic interface circuit for a capacitive sensor, which includes a pair of differential connected capacitors for implementing the measuring method according to claim 1, the electronic circuit including a charge transfer amplifier connected to the common electrode via a switching unit, a logic unit connected to the amplifier output for digital processing of the data supplied by the amplifier and for supplying first and second digital measuring signals, dependent respectively on a first biasing of the fixed electrodes of the capacitors and a second biasing which is the reverse of the first biasing, and a digital-analogue converter capable of supplying a measuring voltage to the electrodes via the switching unit, the measuring voltage being defined on the basis of a binary word conversion relating to the first digital signal stored in a first register of the logic unit or the second digital measuring signal stored in a second register of the logic unit, wherein the logic unit includes an element for calculating a mean connected to the registers, said element being intended to calculate a mean of the first successive digital signals and a mean of the second successive digital signals in at least part of the second series of measuring cycles of a conversion, and a decision counter capable of counting or counting down according to the output state of the charge transfer amplifier for each measuring cycle of a conversion, the decision counter being intended to order the selection of the last digital value of the first digital signal and of the second digital signal at the end of a conversion, if the count or countdown of successive identical states exceeds a predetermined threshold, or the selection of the mean of the first digital signals and the mean of the second digital signals to be stored in the registers if the count or countdown threshold of the decision counter is not exceeded, for a subsequent conversion.

9. The electronic circuit according to claim 8, as an interface for a tri-axis capacitive sensor, which includes three pairs of differential connected capacitors, wherein it includes a single charge transfer amplifier for measurement on the three measuring axes X, Y and Z of the sensor, the amplifier being capable of supplying digital data to the logic unit, to allow the decision counter to carry out a count or countdown according to the output state of the charge transfer amplifier in each successive measuring cycle of a conversion, and wherein the logic unit supplies first and second digital measuring signals for each measurement axis X, Y and Z.

10. The electronic circuit according to claim 9, wherein the logic unit includes six registers for storing the first and second digital measuring signals for each axis, each register being defined in 10 bits.

11. The electronic circuit according to claim 8, wherein it includes a multiplexer controlled by a command signal from the decision counter, so as to supply at output either the last digital signal of each register, if the predetermined threshold is exceeded following the count or countdown in the decision counter, or the mean of the first and second successive digital signals of each axis in the second series of measuring cycles, if the predetermined threshold has not been exceeded, and an element for combining the first and second digital signals of each axis received from the multiplexer in order to supply digital output signals for each axis.

* * * * *